US006542019B1

(12) United States Patent
Lim et al.

(10) Patent No.: US 6,542,019 B1
(45) Date of Patent: Apr. 1, 2003

(54) HIGHLY LINEAR AND LOW NOISE FIGURE MIXER

(75) Inventors: Kyoohyun Lim, San Jose, CA (US); Beomsup Kim, Cupertino, CA (US)

(73) Assignee: Berkäna Wireless, Inc., San Jose, CA (US)

( * ) Notice: Subject to any disclaimer, the term of this patent is extended or adjusted under 35 U.S.C. 154(b) by 0 days.

(21) Appl. No.: 09/996,264

(22) Filed: Nov. 28, 2001

(51) Int. Cl.[7] ............................. G06F 7/44; H03K 5/22
(52) U.S. Cl. ......................................... 327/359; 327/65
(58) Field of Search ................................. 327/355–359, 327/350, 352, 65, 66, 67, 51, 52, 55, 560–563; 330/252, 253, 258, 275; 455/333

(56) References Cited

U.S. PATENT DOCUMENTS

| | | | | |
|---|---|---|---|---|
| 5,289,136 A | * | 2/1994 | DeVeirman et al. | 330/252 |
| 5,532,637 A | | 7/1996 | Khoury et al. | 327/359 |
| 5,561,396 A | * | 10/1996 | Hogervorst et al. | 330/253 |
| 5,589,791 A | | 12/1996 | Gilbert | 327/359 |
| 5,872,446 A | | 2/1999 | Cranford, Jr. et al. | 323/315 |
| 6,087,883 A | | 7/2000 | Gilbert | 327/355 |
| 6,104,242 A | * | 8/2000 | Ezell | 330/252 |
| 6,194,947 B1 | * | 2/2001 | Lee et al. | 327/359 |

OTHER PUBLICATIONS

*Analysis and Design of Analog Integrated Circuits*, John Wiley & Sons, 1984, pp. 705–709, Gray & Meyer.

Technical Paper by Lim et al., "A Fully Integrated CMOS RF Front–End With On–Chip VCO for WCDMA Application," Solid–State Circuits Conf., 2001, Digest of Tech. Papers, ISSCC, 01 IEEE Int'l. 2001, pp. 286, 287 & 455.

* cited by examiner

*Primary Examiner*—Toan Tran
(74) *Attorney, Agent, or Firm*—George O. Saile; Stephen B. Ackerman; Douglas R. Schnabel

(57) ABSTRACT

A new linearized transconductance circuit for converting an input into an output has been achieved. This linearized transconductance circuit is especially suited for application in a mixing circuit using a double-balanced cell. The circuit allows optimization of linearity and noise figure without excessive current. The input comprises first and second phases having a differential voltage therebetween. The output comprises first and second phases having a differential current therebetween that is proportional to the differential voltage. The circuit comprises, firstly, first, second, third, and fourth MOS transistors, with each transistor having a gate, a drain, and a source. The gates of the first and third MOS transistors are coupled to the input first phase. The drains of the first and third transistors are coupled to the output first phase. The gates of the second and fourth MOS transistors are coupled to the input second phase. The drains of the second and fourth MOS transistors are coupled to the output second phase. A first constant current source is coupled to the sources of the first and fourth MOS transistors. Finally, a second constant current source is coupled to the sources of second and third MOS transistors.

23 Claims, 4 Drawing Sheets

HIGHLY LINEAR AND LOW NOISE FIGURE MIXER

BACKGROUND OF THE INVENTION (1). Field of the Invention

The invention relates to a signal processing circuit, and, more particularly, to an improved transconductance stage for a MOS mixer circuit.

(2). Description of the Prior Art

Mixer circuits are widely used in modern communication systems. Mixer circuits have a number of uses. A typical application is for translating signals into desirable frequency bands through a technique called modulation. In a mixing or modulation process, an information signal is superimposed upon a carrier signal. In this way, the information signal may be processed or even transmitted without information loss. Another principle application is for demodulation. In demodulation, a modulated information signal is translated down to an intermediate frequency.

Mixers must be designed to minimize intermodulation distortion. This distortion is principally caused by non-linear translations of the input signal and greatly affects the dynamic range of the communication system. Further, mixers should sustain large interference signals without desensitizing. At the same time, the mixer must maintain a low noise figure to optimize the overall system performance.

Referring now to FIG. 1, a prior art mixing circuit is illustrated. The mixer 10 comprises a transconductance stage 14, a double-balanced cell 18, and a load stage 22. In a typical configuration, the information signal is INPUT1. INPUT1 is a differential voltage that is herein labeled INPUT1 $\phi1$ 26 and INPUT1 $\phi2$ 30.

INPUT1 is processed through a transconductance stage 14. The transconductance stage performs a voltage-to-current conversion to create the differential current $I_{1\phi1}$ 34 and $I_{1\phi2}$ 38. Ideally, the differential currents $I_{1\phi1}$ 34 and $I_{1\phi2}$ 38 are linearly proportional to the differential voltages of INPUT1 $\phi1$ 26 and INPUT1 $\phi2$ 30. The transconductance stage 14 typically comprises a balanced transistor pair as shown in FIG. 2 and as discussed in detail below.

Referring again to FIG. 1, the double-balanced cell 18 is used to commutate the differential currents $I_{1\phi1}$ 34 and $I_{1\phi2}$ 38 onto the INPUT2 signal. INPUT2 is typically a carrier signal, such as a local oscillator (LO). Again, INPUT2 is a differential voltage input labeled INPUT2 $\phi1$ 42 and INPUT2 $\phi2$ 46. The double-balanced cell 18 typically comprises a Gilbert cell, as is well established in the art. The double-balanced cell commutates INPUT2 $\phi1$ 42 and INPUT2 $\phi2$ 46 with $I_{1\phi1}$ 34 and $I_{1\phi2}$ 38 to create the differential output currents $I_{2\phi1}$ 50 and $I_{2\phi2}$ 54.

The load stage 22 is used to convert the differential output currents $I_{2\phi1}$ 50 and $I_{2\phi2}$ 54 into an output voltage, OUTPUT. The load stage 22 typically comprises a set of matching resistors that establish a voltage drop in direct proportion to the differential current $I_{2\phi1}$ 50 and $I_{2\phi2}$ 54. Alternatively, the load stage may comprise an R-C load, an inductive load, a capacitance load, or a set of transistors for further linearity improvement. Once again, the output voltage, OUTPUT, is a differential voltage comprising OUTPUT $\phi1$ 60 and OUTPUT $\phi2$ 64.

The conventional mixer illustrated in FIG. 1 is an active CMOS mixer. That is, the mixing, or commutating, process is performed with active components such as MOS transistors. Compared to passive CMOS mixers, active mixers provide improved conversion gain and better system noise performance. However, the linearity is generally significantly worse.

Referring now again to FIG. 2, a typical configuration of the transconductance stage is shown. The circuit uses two NMOS transistors, M1 80 and M2 84, configured as a balanced pair. In this scheme, a matched pair of NMOS transistors is used. Each device 80 and 84 has the same length and width, the same threshold voltage ($V_{th}$), the same processing parameters, and the same orientation on the substrate. The sources of the transistors 80 and 84 are coupled together and are additionally coupled to a constant current source $I_s$ 88. The gates of the transistors 80 and 84 are coupled to the differential input nodes INPUT $\phi1$ 92 and INPUT $\phi2$ 94. The drains of the transistors 80 and 84 are coupled to the double-balanced cell (not shown) as in FIG. 1.

The analysis of the balanced pair is very well known in the art as given by, for example, Gray and Meyer, *Analysis and Design of Analog Integrated Circuits*, John Wiley & Sons, 1984, pp. 705–709. Of particular importance to the transconductance stage of the mixer, is the transconductance performance of this cell.

Referring now to FIG. 3, the transconductance performance is illustrated. The differential input voltage INPUT $\phi1$ 92 and INPUT $\phi2$ 94 is plotted as $\Delta V_{\phi1-\phi2}$. The differential output current OUTPUT $\phi1$ 96 and OUTPUT $\phi2$ 98 is plotted as $\Delta I_{\phi1-\phi2}$. The inherent offset voltage needed to insure that the balanced pair is operating in the linear range is neglected in this plot. As the differential input voltage $\Delta V_{\phi1-\phi2}$ sweeps from a negative to a positive value, the differential current $\Delta I_{\phi1-\phi2}$ is generated as shown by plots 100, 104, and 108.

Each plot 100, 104, and 108, represents a different operating condition for the balanced pair. For example, plot 100 represents a condition where there is a small difference between the gate-to-source voltage $V_{gs}$ and $V_{th}$. In this case, the balanced pair exhibits a linear transfer only over a relatively small input voltage range, R1. By comparison, plot 104 and plot 108 demonstrate how the linear range can be increased by increasing the relative gate drive. The input range R2 for plot 108 is much larger than R1 and would, therefore, allow a much larger input voltage swing.

Alternatively, the same increase in input range can be achieved by holding the gate-to-source drive constant but reducing the size of the MOS transistors. The size may be reduced by reducing the width-to-length (W/L) ratio of each device. A pair of small MOS transistors will exhibit an increased linear range as shown by plot 108.

Unfortunately, simply decreasing the transistor size (or simply increasing the gate drive) has the undesirable effect of increasing the noise figure for the transconductance stage. This effect puts a limit on the effectiveness of using simple device size choices to improve the circuit performance. It is desirable to achieve the improved linearity of a small MOS pair and the improved noise figure of a large MOS pair in a single circuit.

Several prior art inventions describe mixer circuits. U.S. Pat. No. 5,589,791 to Gilbert describes a mixer comprising bipolar transistors. A multi-tanh doublet transconductance stage is used to improve linearity. U.S. Pat. No. 6,087,883 to Gilbert teaches bipolar multi-tanh cells wherein ratios of emitter areas and emitter resistors are used to increase the input voltage range of a voltage-to-current converter. U.S. Pat. No. 5,532,637 to Khoury et al discloses a bipolar mixer with a transconductance stage. Degeneration emitter resistors are used to expand the input voltage range. U.S. Pat. No. 5,872,446 to Cranford, Jr. et al shows a CMOS analog multiplier circuit with an extended input range. Finally, the present invention is disclosed by the Applicants in the technical paper by Lim et al, titled "A Fully Integrated CMOS RF Front-End with On-Chip VCO for WCDMA Application," published in the Solid-State Circuits Conference, 2001, Digest of Technical Papers, ISSCC, 01 IEEE International, 2001, pages 286, 287, and 455.

SUMMARY OF THE INVENTION

A principal object of the present invention is to provide an effective and very manufacturable transconductance stage for a MOS mixer circuit.

A further object of the present invention is to improve the linearity and noise figure of a transconductance stage of a MOS mixer circuit.

A still further object of the present invention is to improve the linearity and noise figure of a transconductance circuit by using a novel transistor arrangement and size selection.

Another still further object of the present invention is to the improve linearity and the noise figure of a MOS mixing circuit using the improved transconductance circuit.

Another yet still further object of the present invention is to improve linearity and noise figure without consuming more current.

In accordance with the objects of this invention, a new linearized transconductance circuit for converting an input into an output has been achieved. This linearized transconductance circuit is especially suited for application in a mixing circuit using a double-balanced cell. The input comprises first and second phases having a differential voltage therebetween. The output comprises first and second phases having a differential current therebetween that is proportional to the differential voltage. The circuit comprises, firstly, first, second, third, and fourth MOS transistors, with each transistor having a gate, a drain, and a source. The gates of the first and third MOS transistors are coupled to the input first phase. The drains of the first and third transistors are coupled to the output first phase. The gates of the second and fourth MOS transistors are coupled to the input second phase. The drains of the second and fourth MOS transistors are coupled to the output second phase. A first constant current source is coupled to the sources of the first and fourth MOS transistors. Finally, a second constant current source is coupled to the sources of second and third MOS transistors.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses a linearized transconductance circuit of the present invention. This linearized transconductance circuit is applied in a mixer circuit. It should be clear to those experienced in the art that the present invention can be applied and extended without deviating from the scope of the present invention.

Figure 1:
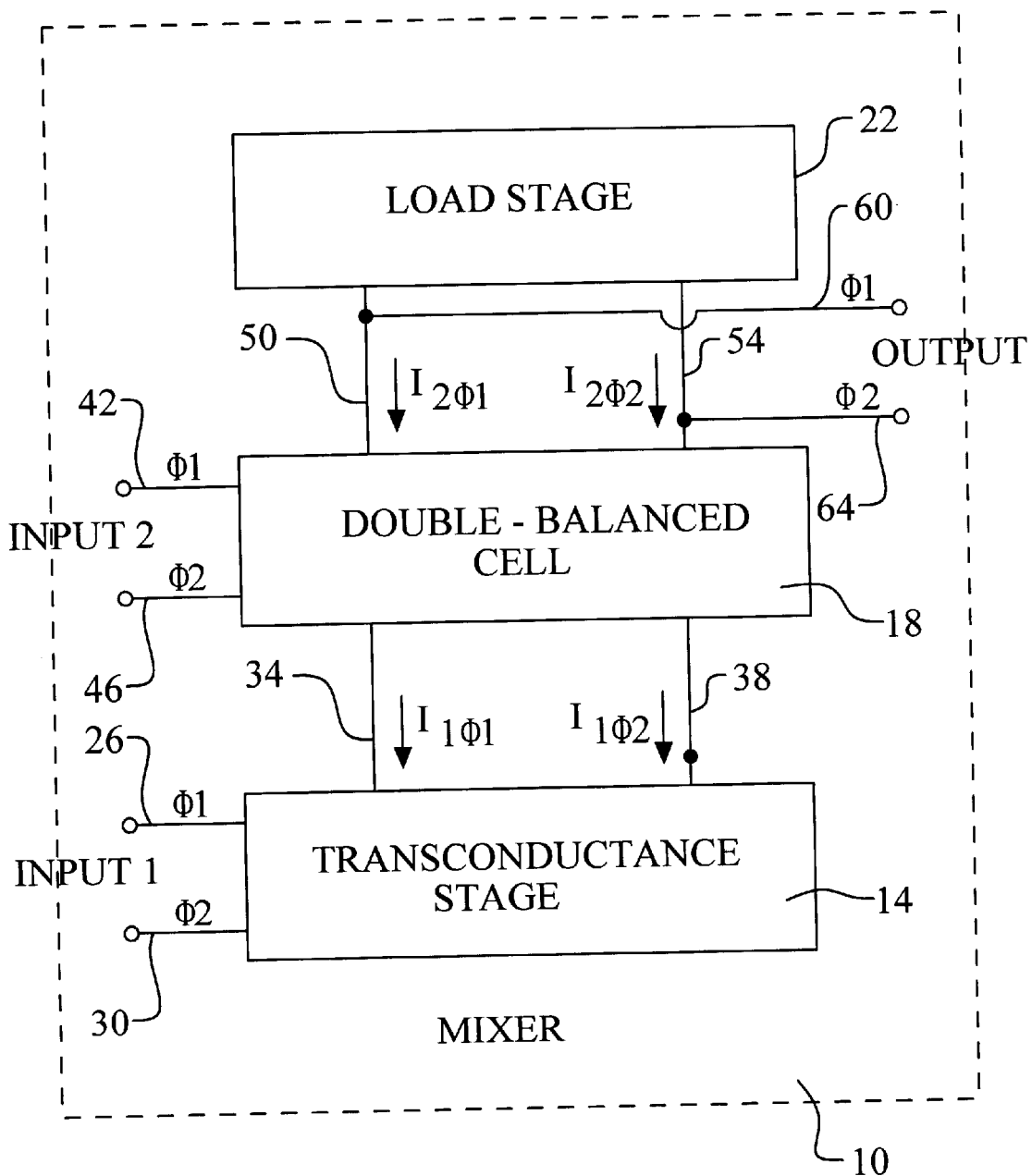
FIG. 1 illustrates a prior art mixing circuit comprising a transconductance stage, a double-balanced cell, and a load stage.
Figure 2:
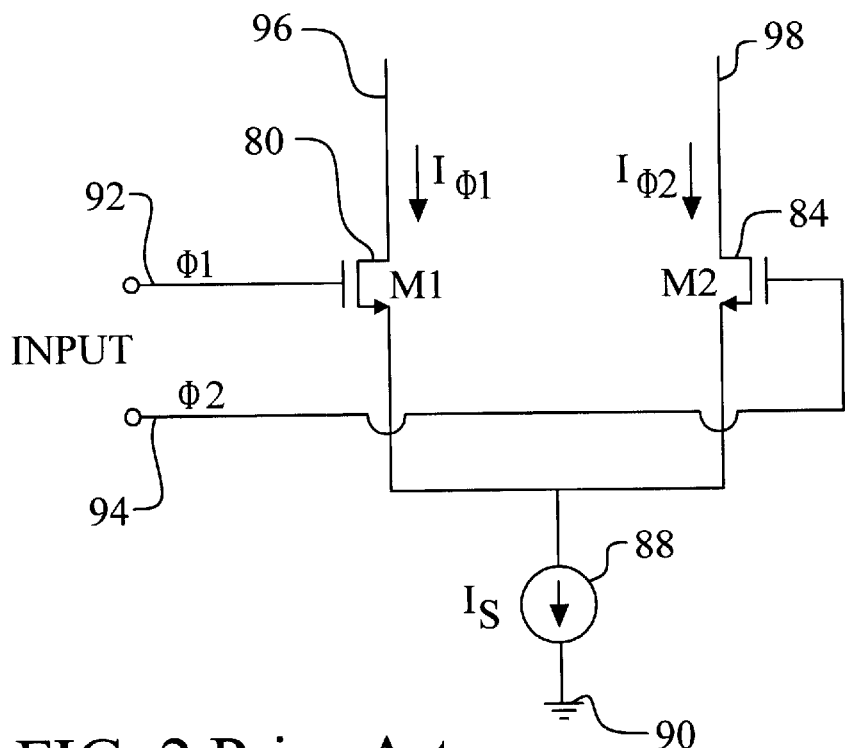
FIG. 2 illustrates a prior art transconductance stage comprising a balanced MOS pair.
Figure 3:
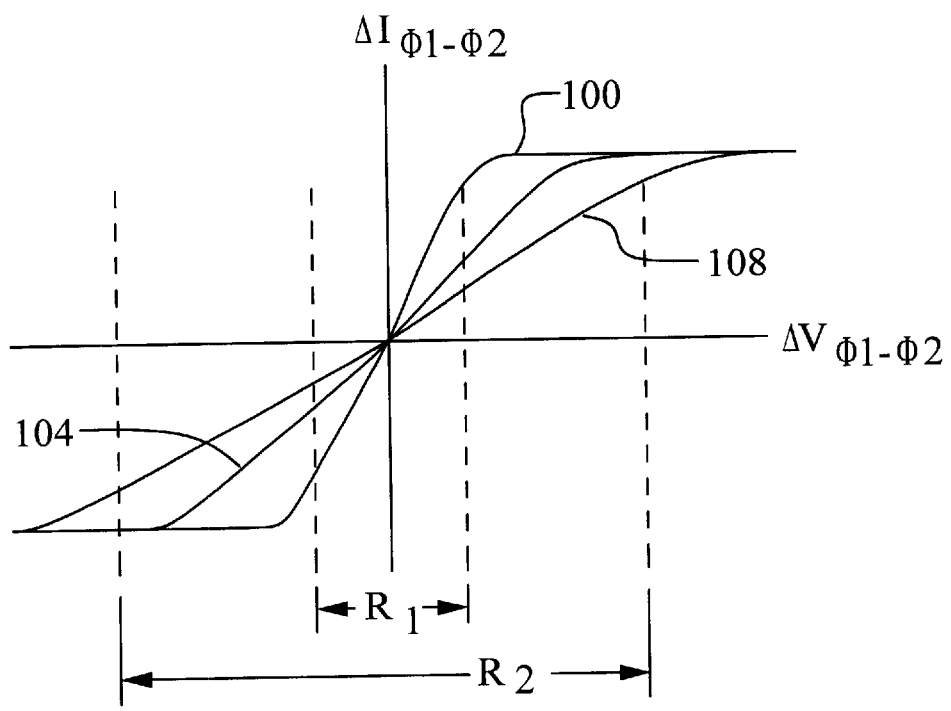
FIG. 3 illustrates differential output current with respect to the differential input voltage for an MOS balanced pair at various gate drives.
Figure 4:
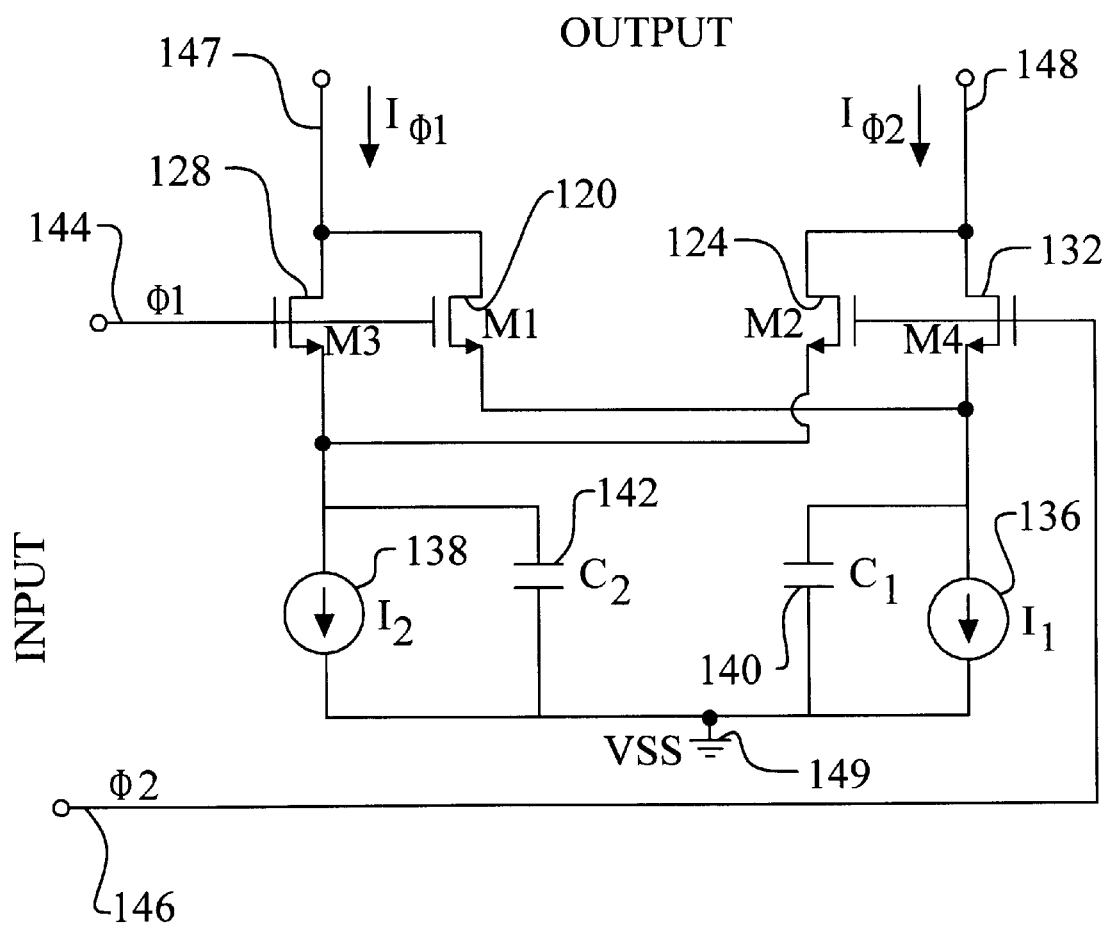
FIG. 4 illustrates the preferred embodiment of the transconductance stage of the present invention.

Referring now to FIG. 4, the preferred embodiment of the present invention is illustrated. Several important features of the present invention are shown. This novel MOS transconductance circuit exhibits superior linearity and noise figure. This linearized transconductance circuit converts an input differential voltage into an output differential current. The input voltage is labeled. INPUT $\phi 1$ 144 and INPUT $\phi 2$ 146. The output current is labeled OUTPUT $I_{\phi 1}$ 147 and OUTPUT $I_{\phi 2}$ 148.

The linearized transconductance circuit comprises four MOS transistors 120, 124, 128, and 132, and more preferably, four NMOS transistors as shown. The circuit is preferably formed using a conventional CMOS process. A version comprising PMOS transistors may alternatively be formed by inverting the structure such that the current sources 136 and 138 are placed between the transistor network and the power supply VDD (not shown).

It is significant to note that the novel approach of the present invention uses MOS transistors to form the linearized transconductance circuit. This is significant because the MOS transistor provides better linearity than the bipolar transistor. Further, the MOS circuit can be easily integrated with a digital, ultra large scale integration (ULSI) MOS design. Finally, the MOS-based linearized transconductance circuit can be produced using a low-cost process.

In the preferred embodiment, each of the four MOS transistors 120, 124, 128, and 132, has a gate, a drain, and a source. The important couplings are shown in FIG. 4. The gates of the first MOS transistor, M1 120, and the third MOS transistor, M3 128, are coupled to the input first phase, INPUT $\phi 1$ 144. The drains of the first MOS transistor, M1 120, and the third MOS transistor, M3 128, are coupled to the output first phase, OUTPUT $I_{\phi 1}$ 147. The gates of the second MOS transistor, M2 124, and the fourth MOS transistor, M4 132, are coupled to the input second phase, INPUT $\phi 2$ 146. The drains of the second MOS transistor, M2 124, and the fourth MOS transistor, M4 132, are coupled to the output second phase OUTPUT $I_{\phi 2}$ 148. A first constant current source, I1 136, is coupled to the sources of the first MOS transistor, M1 120, and the fourth MOS transistor, M4 132. A second constant current source, I2 138, is coupled to the sources of the second MOS transistor, M2 124, and the third MOS transistor, M3 128.

Figure 5:
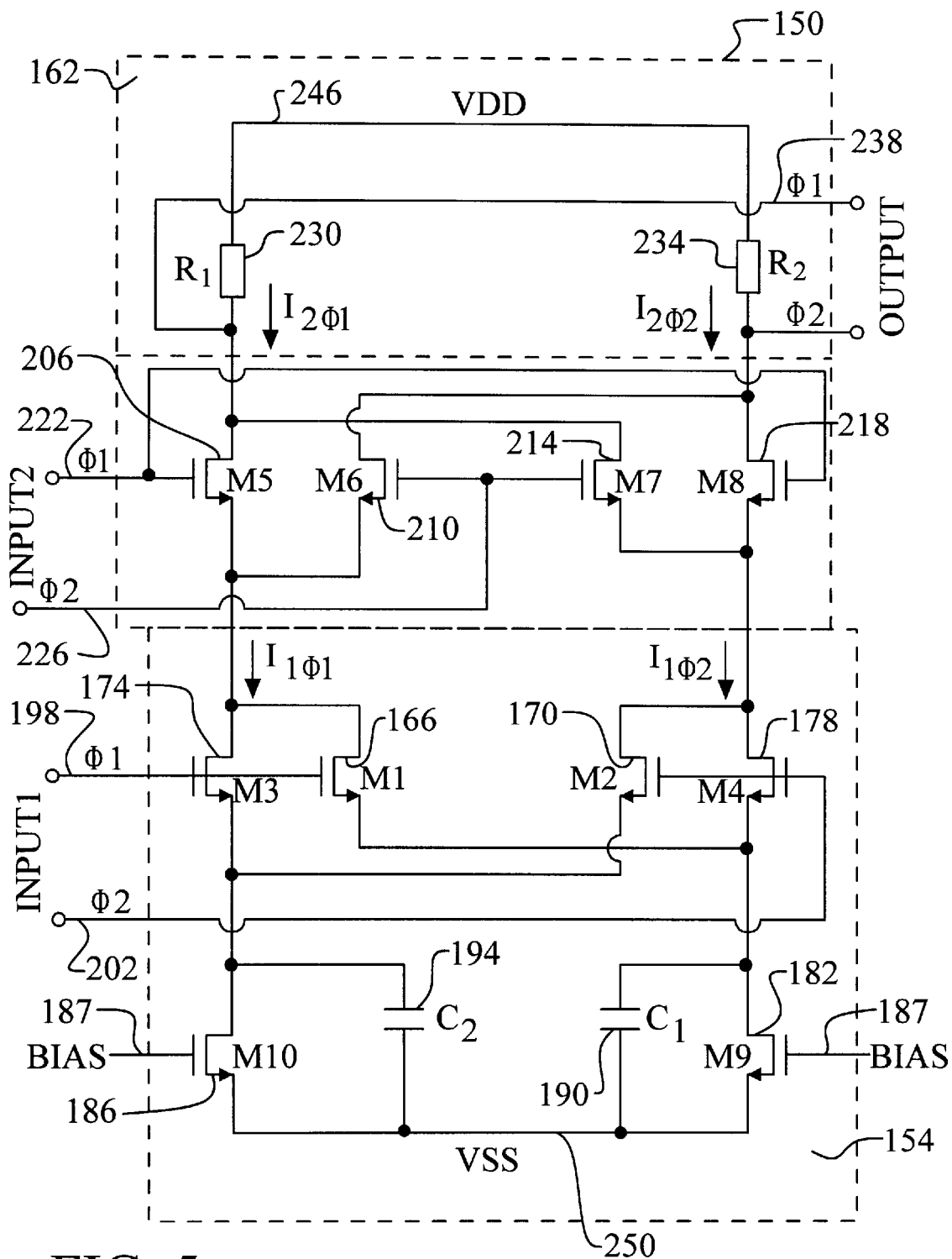
FIG. 5 illustrates the preferred embodiment of the mixer circuit using the transconductance stage of the present invention.

In the preferred embodiment, the first and second constant current sources, I1 136 and I2 138, comprise the same value. Therefore, under balanced conditions, the combined current flowing through the first and fourth MOS transistors, M1 120 and M4 132, is equal to the combined current flowing through the second and third MOS transistors, M2 124 and M3 128. This is an important feature for achieving a balanced, linear transfer characteristic. In the preferred embodiment, the constant current sources I1 136 and I2 138 comprise MOS transistors as shown in FIG. 5.

Referring again to FIG. 4, as a most important feature, the MOS transistors 120, 124, 128, and 132, should be sized in a particular scheme. MOS transistors M1 120 and M2 124 should be designed with a common, first width-to-length (W/L) ratio. MOS transistors M3 128 and M4 132 should be designed with a common, second width-to-length (W/L) ratio. Further, the second width-to-length (W/L) ratio should be greater than the first width-to-length (W/L) ratio. By designing M1 and M2 with a common, small, first width-to-length (W/L) ratio and M3 and M4 with a Or common, large, second width-to-length (W/L) ratio, the novel scheme exhibits a greatly improved transconductance linearity and noise figure.

More particularly, M1 120 and M2 124 create a small first balanced pair. Due to the small W/L ratio, this balanced pair exhibits a large linear input range. The larger balanced pair, comprising M3 128 and M4 132, exhibits a preferred noise figure. However, the linear range is less. The novel combination of the small balanced pair and the large balanced pair is achieved by coupling across the sources. This configuration allows the present invention to achieve improved linearity and an improved noise figure. In the preferred embodiment, the common, large, second width-to-length (W/L) ratio is between about 4 times and 7 times the common, small, first width-to-length (W/L) ratio.

As a further improvement to the present invention, tail capacitors C1 140 and C2 142 may be coupled in parallel with the constant current sources 136 and 138, respectively. The capacitors C1 and C2 attenuate high frequency noise components to further improve the linearity and noise figure of the circuit. For example, the tail capacitors C1 and C2 may comprise between about 10 pF and 20 pF. More generally, the tail capacitors C1 and C2 may comprise any capacitive devices or loads.

The preferred embodiment of the linearized transconductance circuit of FIG. 4 exhibits a linear transfer function over an input voltage range of between about 400 mV and 1 V. A noise figure of between about 10 and 13 is simultaneously achieved.

It should be noted that the linear transconductance circuit may comprise either all NMOS or all PMOS transistors. In the preferred embodiment of FIG. 4, the transconductance circuit comprises NMOS transistors M1–M4 with current sources I2 138 and I1 136 from the VSS rail 149. Alternatively, the linear transconductance stage may comprise PMOS transistors M1–M4 with current sources I1 136 and I2 138 coupled from the upper supply (VDD) rail.

Referring now to FIG. 5, the preferred embodiment of the linearized transconductance circuit is applied in a mixer circuit 150. The mixer 150 comprises the linearized transconductance circuit 154, a double-balanced cell 158, and a load stage 162. The connectivity of the linearized transconductance circuit 154 is the same as that shown in FIG. 4. In this case, however, the constant current sources comprise NMOS transistors M9 182 and M10 186. Each of these NMOS transistors M9 182 and M10 186 is biased to a common voltage, BIAS 187, so that a common, constant current is created. The tail capacitors, C1 190 and C2 194, are used to improve performance.

The first input, INPUT1, comprises a differential voltage INPUT1 $\phi$1 198 and INPUT1 $\phi$2 202. The first input is coupled to the linearized transconductance stage 154 as in FIG. 4. Referring again to FIG. 5, the second input is coupled to the double-balanced cell 158 in conventional fashion. This second input comprises a differential voltage INPUT2 $\phi$1 222 and INPUT2 $\phi$2 226. The double-balanced cell preferably comprises a Gilbert cell formed with four MOS transistors, M5 206, M6 210, M7 214, and M8 218, as shown.

The linearized transconductance stage 154 converts the first differential voltage input, INPUT1 $\phi$1 198 and INPUT1 $\phi$2 202, into the first differential current output, $I_{1\phi1}$ and $I_{1\phi2}$. The double-balanced cell 158 commutates the first differential current output, $I_{1\phi1}$ and $I_{1\phi2}$, and the second differential voltage input, INPUT2 $\phi$1 222 and INPUT2 $\phi$2 226, to create the second differential current output, $I_{2\phi1}$ and $I_{2\phi2}$. Finally, this second differential current output, $I_{2\phi1}$ and $I_{2\phi2}$, is converted into an output voltage, OUTPUT $\phi$1 238 and OUTPUT $\phi$2 242, by the load stage 162. The load stage 162 simply comprises a matched impedance pair LOAD1 230 and LOAD2 234, through which the second differential current output, $I_{2\phi1}$ and $I_{2\phi2}$, flows to create a voltage drop. The load stage may comprise a match pair of resistors, resistor-capacitor (R-C) loads, capacitors, inductors, or MOS transistors for enhanced linearity.

The present invention enhances the linearity performance while improving the noise figure. It is found that, in the prior art, optimization of linearity and noise figure are a design trade-off. However, in the present invention, it is possible to increase the noise figure without directly degrading the linearity. Further, the trade-off problem is overcome without consuming more current.

It should be noted, again, that the linear transconductance circuit may comprise either all NMOS or all PMOS transistors. In the preferred embodiment of FIG. 5, the transconductance circuit 154 comprises NMOS transistors M1–M4, the current source comprises NMOS transistors M10 and M9 from the VSS rail 250, and the double balanced cell comprises NMOS transistors M5–M8. Alternatively, the mixer circuit may be inverted such that the linear transconductance stage 154, the current sources, and the double balanced cell comprise PMOS transistors with the current sources coupled from the upper supply (VDD) rail and the load stage coupled to the lower rail (VSS). Finally, the mixer circuit may comprise a combination of NMOS and PMOS devices.

The advantages of the present invention may now be summarized. First, an improved MOS transconductance circuit has been achieved. Second, the novel configuration of a small balanced pair and a large balanced pair achieves improved linearity and noise figure. Finally, this improved MOS transconductance circuit has been incorporated into a mixer circuit to achieve improved performance.

As shown in the preferred embodiments, the novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A linearized transconductance circuit for converting an input into an output wherein said input comprises first and second phases having a differential voltage therebetween and wherein said output comprises first and second phases having a differential current therebetween that is proportional to said differential voltage comprising:

first, second, third, and fourth MOS transistors, each said transistor having a gate, a drain, and a source, wherein said gates of said first and third MOS transistors are coupled to said input first phase, wherein said drains of said first and third transistors are coupled to said output first phase, wherein said gates of said second and fourth MOS transistors are coupled to said input second phase, and wherein said drains of said second and fourth MOS transistors are coupled to said output second phase;

a first constant current source coupled to said sources of said first and fourth MOS transistors;

a second constant current source coupled to said sources of second and third MOS transistors;

a first capacitor coupled in parallel with said first constant current source; and a second capacitor coupled in parallel with said second constant current source.

2. The circuit according to claim 1 wherein said first, second, third, and fourth MOS transistors comprise NMOS transistors.

3. The circuit according to claim 1 wherein said first, second, third, and fourth MOS transistors comprise PMOS transistors.

4. The circuit according to claim 1 wherein said first constant current source and said second constant current source comprise the same current value.

5. The circuit according to claim 1 wherein said first and second constant current sources comprise MOS transistors.

6. The circuit according to claim 1 wherein said first MOS transistor and said second MOS transistor have a common, first width-to-length (W/L) ratio, wherein said third MOS transistor and said fourth MOS transistor have a common, second width-to-length (W/L) ratio, and wherein said first width-to-length (W/L) ratio is smaller than said second width-to-length (W/L) ratio.

7. The circuit according to claim 6 wherein said second width-to-length (W/L) ratio is between about 4 times and 7 times said first width-to-length (W/L) ratio.

8. A linearized transconductance circuit for converting an input into an output wherein said input comprises first and second phases having a differential voltage therebetween and wherein said output comprises first and second phases having a differential current therebetween that is proportional to said differential voltage comprising:

first, second, third, and fourth MOS transistors, each transistor having a gate, a drain, and a source, wherein said gates of said first and third MOS transistors are coupled to said input first phase, wherein said drains of said first and third transistors are coupled to said output first phase, wherein said gates of said second and fourth MOS transistors are coupled to said input second phase, wherein said drains of said second and fourth MOS transistors are coupled to said output second phase, wherein said first MOS transistor and said second MOS transistor have a common, first width-to-length (W/L) ratio, wherein said third MOS transistor and said.fourth MOS transistor have a common, second width-to-length (W/L) ratio, and wherein said first width-to-length (W/L) ratio is smaller than said second width-to-length (W/L) ratio;

a first constant current source coupled to said sources of said first and fourth MOS transistors;

a second constant current source coupled to said sources of second and third MOS transistors wherein said first and second constant current sources comprise the same current value;

a first capacitor coupled in parallel with said first constant current source; and a second capacitor coupled in parallel with said second constant current source.

9. The circuit according to claim 8 wherein said first, second, third, and fourth MOS transistors comprise NMOS transistors.

10. The circuit according to claim 8 wherein said first, second, third, and fourth MOS transistors comprise PMOS transistors.

11. The circuit according to claim 8 wherein said first and second constant current sources comprise MOS transistors.

12. A mixer circuit for multiplying a first input and a second input to create an output wherein said first input comprises first and second phases having a differential voltage therebetween, wherein said second input comprises first and second phases having a differential voltage therebetween, and wherein said output wherein said first input comprises first and second phases having a differential voltage therebetween, said circuit comprising:

a linearized transconductance cell for converting said first input into a first current wherein said first current comprises first and second phases having a differential current therebetween that is proportional to said first input differential voltage comprising:

first, second, third, and fourth MOS transistors, each said transistor having a gate, a drain, and a source, wherein said gates of said first and third MOS transistors are coupled to said first input first phase, wherein said drains of said first and third transistors are coupled to said first current first phase, wherein said gates of said second and fourth MOS transistors are coupled to said first input second phase, wherein said drains of said second and fourth MOS transistors are coupled to said first current second phase;

a first constant current source coupled to said sources of said first and fourth MOS transistors; and a second constant current source coupled to said sources of second and third MOS transistors;

a first capacitor coupled in parallel with said first constant current source;

a second capacitor coupled in parallel with said second constant current source;

a double-balanced cell for multiplying said second input and said first current to create a second current wherein said second current comprises first and second phases having, a differential current therebetween that is proportional to the product of said second input and said first current; and a load cell for converting said second current into said output.

13. The circuit according to claim 12 wherein said first, second, third, and fourth MOS transistors comprise NMOS transistors.

14. The circuit according to claim 12 wherein said first and second constant current sources comprise NMOS transistors.

15. The circuit according to claim 12 wherein said double balanced cell comprises NMOS transistors.

16. The circuit according to claim 12 wherein all said MOS transistors, said constant current sources, and said double balanced cell comprise NMOS transistors.

17. The circuit according to claim 12 wherein said first, second, third, and fourth MOS transistors comprise PMOS transistors.

18. The circuit according to claim 12 wherein said first and second constant current sources comprise PMOS transistors.

19. The circuit according to claim 12 wherein said double balanced cell comprises PMOS transistors.

20. The circuit according to claim 12 wherein all said MOS transistors, said constant current sources, and said double balanced cell comprise PMOS transistors.

21. The circuit according to claim 12 wherein said first MOS transistor and said second MOS transistor have a common, first width-to-length (W/L) ratio, wherein said third MOS transistor and said fourth MOS transistor have a common, second width-to-length (W/L) ratio, and wherein said first width-to-length (W/L) ratio is smaller than said second width-to-length (W/L) ratio.

22. The circuit according to claim 21 wherein said second width-to-length (W/L) ratio is between about 4 times and 7 times said first width-to-length (W/L) ratio.

23. The circuit according to claim 12 wherein said load cell consists of one of the group of: resistor load, resistors and capacitor load, capacitor load, inductor load, and MOS transistor load.

* * * * *